(12) United States Patent
Zhou

(10) Patent No.: US 10,418,286 B2
(45) Date of Patent: Sep. 17, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 39 days.

(21) Appl. No.: 15/843,316

(22) Filed: Dec. 15, 2017

(65) Prior Publication Data

US 2018/0174921 A1 Jun. 21, 2018

(30) Foreign Application Priority Data

Dec. 16, 2016 (CN) .......................... 2016 1 1168687

(51) Int. Cl.
*H01L 21/82* (2006.01)
*H01L 21/28* (2006.01)
(Continued)

(52) U.S. Cl.
CPC ........... *H01L 21/823814* (2013.01); *H01L 21/28518* (2013.01); *H01L 21/76897* (2013.01); *H01L 21/823821* (2013.01); *H01L 21/823871* (2013.01); *H01L 27/092* (2013.01); *H01L 27/0924* (2013.01); *H01L 29/41791* (2013.01); *H01L 29/45* (2013.01); *H01L 29/66545* (2013.01); *H01L 21/76843* (2013.01); *H01L 21/76855* (2013.01)

(58) Field of Classification Search
CPC ................................................ H01L 21/823871
See application file for complete search history.

(56) References Cited

U.S. PATENT DOCUMENTS 9,390,981 B1 * 7/2016 Basker ............. H01L 21/823814
9,412,840 B1 * 8/2016 Leobandung ..... H01L 29/66545
(Continued)

OTHER PUBLICATIONS

The European Patent Office (EPO) The Extended European Search Report for 17206191.3 dated Jun. 5, 2018 9 Pages.

*Primary Examiner* — Moazzam Hossain
*Assistant Examiner* — Omar F Mojaddedi
(74) *Attorney, Agent, or Firm* — Anova Law Group, PLLC

(57) ABSTRACT

A semiconductor structure and a fabrication method are provided. The fabrication method includes providing a substrate, including a first region and a second region; forming a first doped region in the first region of the substrate, the first doped region having first doping ions; forming a second doped region in the second region of the substrate, the second doped region having second dopant ions with a conductivity type opposite to the first doping ions; forming a first metallide on a surface of the first doped region having the first doping ions; and forming a second metallide on a surface of the second doped region having the second doping ions, the second metallide and the first metallide being made of different materials.

16 Claims, 7 Drawing Sheets

(51) Int. Cl.
*H01L 27/092* (2006.01)
*H01L 21/8238* (2006.01)
*H01L 21/768* (2006.01)
*H01L 21/285* (2006.01)
*H01L 29/45* (2006.01)
*H01L 29/417* (2006.01)
*H01L 29/66* (2006.01)

(56) References Cited

U.S. PATENT DOCUMENTS

2005/0156208 A1* 7/2005 Lin .................. H01L 21/823814
                                                          257/288
2015/0243663 A1   8/2015 Hung et al.

* cited by examiner

US 10,418,286 B2

SEMICONDUCTOR STRUCTURE AND FABRICATION METHOD THEREOF

CROSS-REFERENCES TO RELATED APPLICATIONS

This application claims the priority of Chinese patent application No. 201611168687.5, filed on Dec. 16, 2016, the entirety of which is incorporated herein by reference.

FIELD OF THE DISCLOSURE

The present disclosure generally relates to the field of semiconductor manufacturing technologies and, more particularly, relates to a semiconductor structure and a fabrication method thereof.

BACKGROUND

With the rapid development of semiconductor technologies, the feature size of semiconductor devices continues to decrease. A reduced feature size means that a larger number of transistors can be arranged on a chip, which meets higher requirements for the semiconductor manufacturing technologies.

Semiconductors (e.g., a gate and source/drain doped regions) and external circuits are usually electrically connected with each other via a metal plug. However, since the Fermi energy levels of a metal and a semiconductor are quite different, the potential barrier between the metal plug and the semiconductor is relatively high, resulting in a very large contact resistance between the metal plug and the semiconductor. Conventionally, the contact resistance is reduced by forming a metal silicide between the metal plug and the semiconductor, thereby improving the performance of semiconductor structures.

However, semiconductor structures formed by conventional technologies still have a large contact resistance between the metal plug and the semiconductor. The disclosed semiconductor structure and method are directed to solve one or more problems set forth above and other problems in the art.

BRIEF SUMMARY OF THE DISCLOSURE

One aspect of the present disclosure includes a method for fabricating a semiconductor structure. The fabrication method includes: providing a substrate, including a first region and a second region; forming a first doped region in the first region of the substrate, the first doped region having first doping ions; forming a second doped region in the second region of the substrate, the second doped region having second dopant ions with a conductivity type opposite to the first doping ions; forming a first metallide on a surface of the first doped region having the first doping ions; and forming a second metallide on a surface of the second doped region having the second doping ions, the second metallide and the first metallide being made of different materials.

Another aspect of the present disclosure includes a semiconductor structure. The semiconductor structure includes a substrate, including a first region and a second region; a first doped region in the first region of the substrate and having first doping ions; a second doped region in the second region and having second doping ions with a conductivity type opposite to the first doping ions; a first metallide on the surface of the first doped region having the first doping ions; and a second metallide on the surface of the second doped region having the second doping ions, the second and first metallides being made of different materials.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
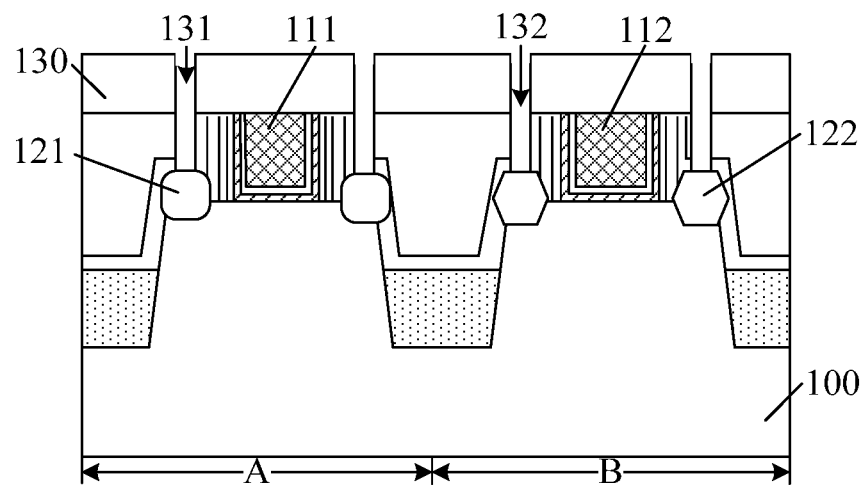
FIGS. 1 and 2 illustrate schematic structural views of a semiconductor structure corresponding to certain stages of its fabrication.
Figure 2:
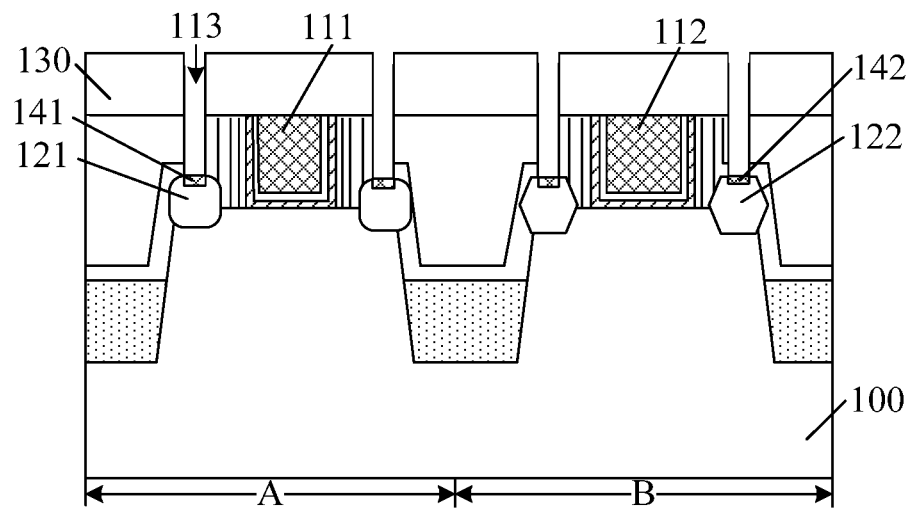

FIGS. 1 and 2 illustrate schematic structural views of a semiconductor structure.

As shown in FIG. 1, a substrate 100 is provided, and the substrate 100 includes a first region A and a second region B. A first gate structure 111 is located on the first region A of the substrate 100, and a first source/drain doped region 121 is located on the first region A of the substrate 100 on both sides of the first gate structure 111. A second gate structure 112 is located on the second region B of the substrate 100, and a second source/drain doped region 122 is located on the second region B of the substrate 100 on both sides of the second gate structure 112. A dielectric layer 130 is also located on the substrate 100. The dielectric layer 130 includes a first contact hole 131, with the bottom of the first contact hole 131 exposing the first source/drain doped region 121. The dielectric layer 130 further includes a second contact hole 132, with the bottom of second contact hole 132 exposing the second source/drain doped region 122.

As shown in FIG. 2, a first metal silicide 141 is formed on the surface of the first source/drain doped region 121, and a second metal silicide 142 is formed on the surface of the second source/drain doped region 122.

Subsequently, a first plug 141 is formed in the first contact hole 131, and a second plug 142 is formed in the second contact hole 132.

The first region A is used to form an NMOS transistor, and the second region B is used to form a PMOS transistor. To simplify the process flow, the first metal silicide 141 and the second metal silicide 142 are made of the same material. However, the NMOS transistor and PMOS transistor have different requirements on the metal silicide material. For the P-type doped region, the height of the barrier formed between the P-type doped region and NiPtSi is smaller than the height of the barrier formed between the P-type doped region and TiSi. On the other hand, for the N-type doped region, the height of the barrier formed between the N-type doped region and TiSi is smaller than the height of the barrier formed between the N-type doped region and NiPtSi. Because the first metal silicide 141 and the second metal silicide 142 are made of the same material, the contact resistance between the first plug and the first source/drain doped region 121 and the contact resistance between the second plug and the second source/drain doped region 122 may not be reduced simultaneously. Therefore, semiconductor structures formed by such a conventional method tend to have poor performance.

The present disclosure provides a semiconductor structure and a method for forming the semiconductor structure to reduce the contact resistance between the metal plug and the semiconductor and improve the performance of the formed semiconductor structure. In the present disclosure, a substrate is provided, including a first region and a second region. A first doped region is formed in the first region of the substrate, and there are first doping ions within the first doped region. A second doped region is formed in the second region of the substrate, and there are second doping ions within the second doped region. The first doping ions and the second doping ions have opposite conductivity types. A first metallide is formed on the surface of the first doped region, and a second metallide is formed on the surface of the second doped region. The first metallide and the second metallide are made of different materials.

Because the doping ions in the first doped region and the doping ions in the second doped region have opposite conductivity types, and because the first metallide and the second metallide are made of different materials, the materials of the first metallide and the second metallide can be selected according to the conductivity types of the doping ions in the first doped region and the second doped region, such that the height of the barrier on the contact surface of the first doped metallide and the first doped region and the height of the barrier on the contact surface of the second metallide and the second doped region can be reduced separately. As a result, the contact resistance between the first metallide and the first doped region can be effectively reduced while effectively reducing the contact resistance between the second metallide and the second doped region. Therefore, the performance of the formed semiconductor structure is improved.

Figure 17:
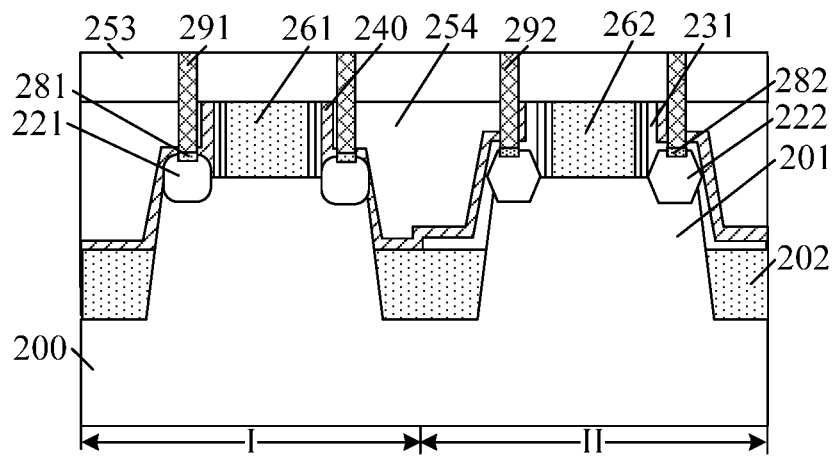
Figure 18:
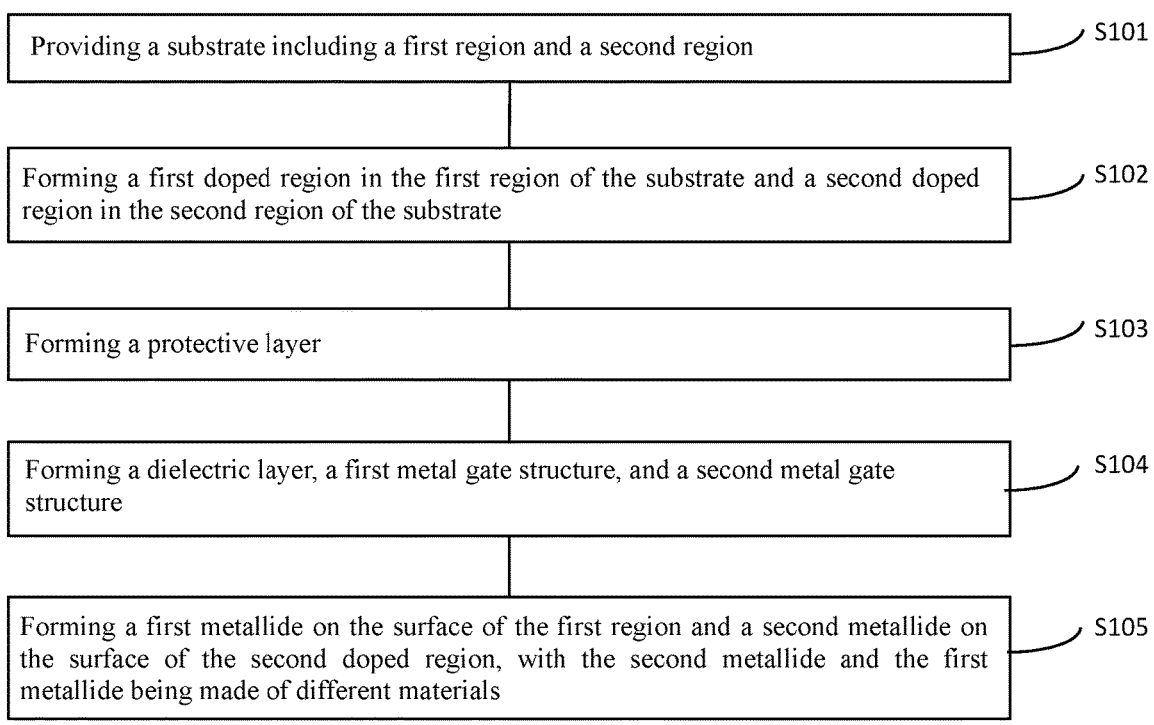
FIG. 18 illustrates an exemplary fabricating process of a semiconductor structure consistent with various disclosed embodiments.

FIG. 18 illustrates an exemplary fabrication process of a semiconductor structure consistent with various disclosed embodiments; and FIGS. 3~17 illustrate schematic structural views of semiconductor structures corresponding to certain stages of the exemplary fabrication process consistent with various disclosed embodiments.

Figure 3:
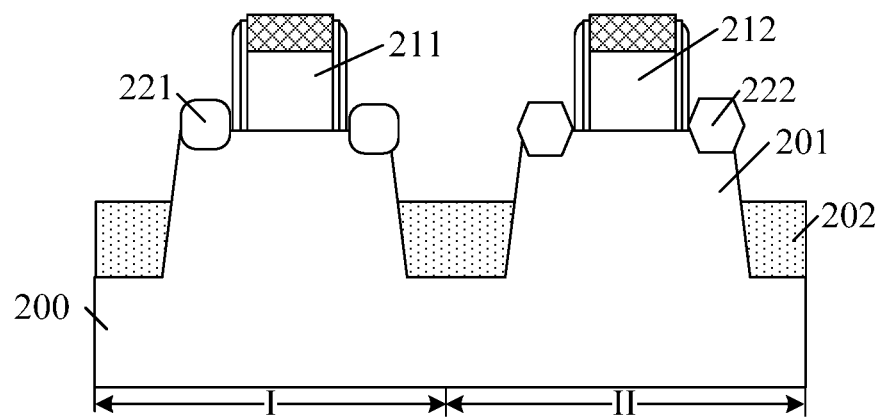
FIGS. 3~17 illustrate schematic structural views of a semiconductor structure corresponding to certain stages of a fabrication process consistent with various disclosed embodiment.

As shown in FIG. 18, at the beginning of the fabrication process, a substrate is provided (S101). As shown in FIG. 3, a substrate is provided, and the substrate includes a first region I and a second region II.

In one embodiment, the substrate includes a base substrate 200 and a plurality of fins 201 on the base substrate 200. In other embodiments, the substrate may also be a planar substrate, and the planar substrate may be a silicon substrate, a germanium substrate, or a silicon germanium substrate.

In one embodiment, the base substrate 200 and the fins 201 may be made of silicon, germanium or silicon germanium.

In one embodiment, the first region I is used to form a PMOS transistor, and the second region II is used to form an NMOS transistor. In other embodiments, the first region and the second region may also be used to form a triode or a diode.

In one embodiment, the fabrication method further includes forming an isolation structure 202 on the base substrate 200. The isolation structure 202 covers a portion of the sidewall of the fins 201, and the surface of the isolation structure 202 is lower than the top surface of the fins 201.

In one embodiment, the isolation structure 202 may be made of silicon oxide.

As shown in FIG. 3, a first gate structure 211 is formed in the first region I of the substrate, and a second gate structure 212 is formed in the second region II of the substrate.

In one embodiment, the first gate structure 211 spans across the fin 201 in the first region I, and the first gate structure 211 covers a portion of the sidewall and top surface of the fin 201. The second gate structure 212 spans across the fin 201 in the second region II, and the second gate structure 212 covers a portion of the sidewall and top surface of the second region II.

In other embodiments, the first region is used to form a diode or a triode, and the fabrication method does not include the process of forming the first gate structure and the second gate structure.

In one embodiment, the PMOS transistor and the NMOS transistor are formed by a rear gate process, with the first gate structure 211 and the second gate structure 212 being pseudo gate structures. In other embodiments, the PMOS transistor and the NMOS transistor may also be formed by a front gate process.

In one embodiment, the first gate structure 211 includes a first gate dielectric layer (not indicated) across the fin 201 in the first region I, and the first gate dielectric layer covers a portion of the sidewall and top surface of the fin 201. A first gate electrode is located on the first gate dielectric layer.

In one embodiment, a first mask layer is located on the first gate electrode.

In one embodiment, the second gate structure 212 includes a second gate dielectric layer (not indicated) across the fin 201 in the second region II, and the second gate dielectric layer covers a portion of the sidewall and top surface of the fin 201. A second gate electrode is located on the second gate dielectric layer.

In one embodiment, a second mask layer is located on the second gate electrode.

In one embodiment, the first gate electrode and the second gate electrode may be made of polysilicon. In other embodiments, the first gate electrode and the second gate electrode may also be made of polycrystalline germanium or polysilicon germanium.

In one embodiment, the first gate dielectric layer and the second gate dielectric layer may be made of silicon oxide.

In one embodiment, the first mask layer and the second mask layer may be made of silicon nitride. In other implementations, the first mask layer and the second mask layer may also be made of silicon oxynitride.

Returning to FIG. 18, after providing the substrate, the fabrication method further includes forming a first doped region in the first region of the substrate and forming a second doped region in the second region of the substrate (S102).

As shown in FIG. 3, a first doped region 221 is formed in the first region I of the substrate, with first doping ions within the first doped region 221.

The first doped region 221 is used as a source/drain doped region of the formed PMOS transistor. In other embodiments, the first region is used to form a diode, and the first doped region is used to form the anode of a diode.

In one embodiment, the process of forming the first doped region 221 includes: forming a first trench in the fin 201 on both sides of the first gate structure 211; forming a first doped layer in the first trench; and doping the first doping ions into the first doped layer to form the first doped region 221. In other embodiments, the process of forming the first doped region includes ion implanting the first region of the substrate with the first gate structure as a mask to form a first doped region.

In one embodiment, the process of forming the first trench may include dry etching, wet etching, or a combination of dry etching and wet etching.

In one embodiment, the process of forming the first doped layer includes an epitaxial growth process.

In one embodiment, the first doping ions are doped into the first doped layer through in-situ doping.

In one embodiment, the first region I is used to form a PMOS transistor, and the first doping ions are P-type ions, for example, boron ion or $BF^{2-}$ ion.

As shown in FIG. 3, a second doped region 222 is formed in the second region II of the substrate, with the second doping ions in the second doped region 222. The first doping ions and the second doping ions have opposite conductivity types.

The second doped region 222 is used to form the source/drain doped region of an NMOS transistor. In other embodiments, the first doped region is used to form the anode of a diode, and the second doped region is used to form the cathode of a diode.

In one embodiment, the process of forming the second doped region 222 includes forming a second trench in the fin 201 on both sides of the second gate structure 212; forming a second doped layer in the second trench; and doping the second doping ions into the second doped layer to form the second doped region 222. In other embodiments, the process of forming the second doped region may include ion implanting the second region of the substrate using the second gate structure as a mask to form a second doped region.

In one embodiment, the process of forming the second trench may include a combination of dry etching and wet etching.

In one embodiment, the process of forming the second doped layer includes an epitaxial growth process.

In one embodiment, the second doped region 222 is formed by in-situ doping the second doped layer, and the second doping ions are doped into the second doped layer.

In one embodiment, the second region II is used to form an NMOS transistor, and the second doping ions are N-type ions, such as phosphorous or arsenic ions.

Returning to FIG. 18, after forming the first doped region and the second doped region, the fabrication method further includes forming a protective layer (S103).

Subsequently, a first metallide is formed on the surface of the first doped region 221, and a second metallide is formed on the surface of the second doped region 222. The second metallide and the first metallide are made of different materials.

The fabrication method further includes forming a dielectric layer in the first region I and the second region II of the substrate. The dielectric layer in the first region I has a first contact hole, and the first contact hole extends through the dielectric layer in the first doped region 221. The dielectric layer in the second doped region II has a second contact hole, and the second contact hole extends through the dielectric layer in the second doped region 222.

In one embodiment, the fabrication method further includes forming a first metal gate structure and a second metal gate structure.

In one embodiment, the process of forming the dielectric layer, the first metal gate structure, the second metal gate structure, the first metallide, and the second metallide are shown in FIGS. 4~16.

Figure 4:
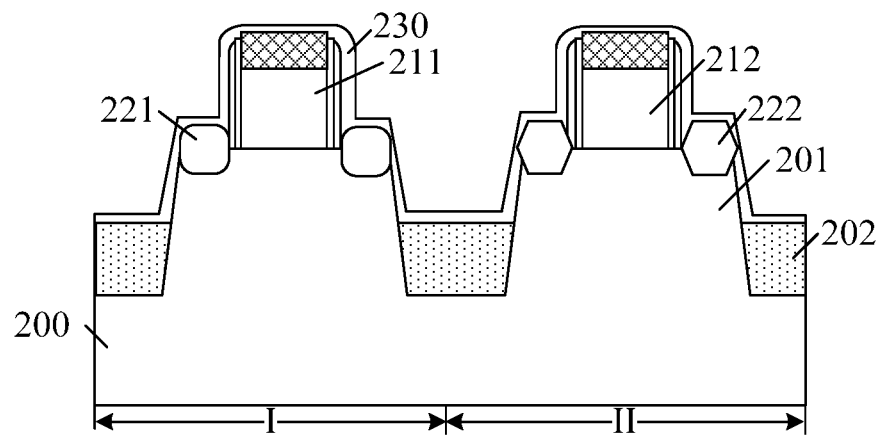
Figure 5:
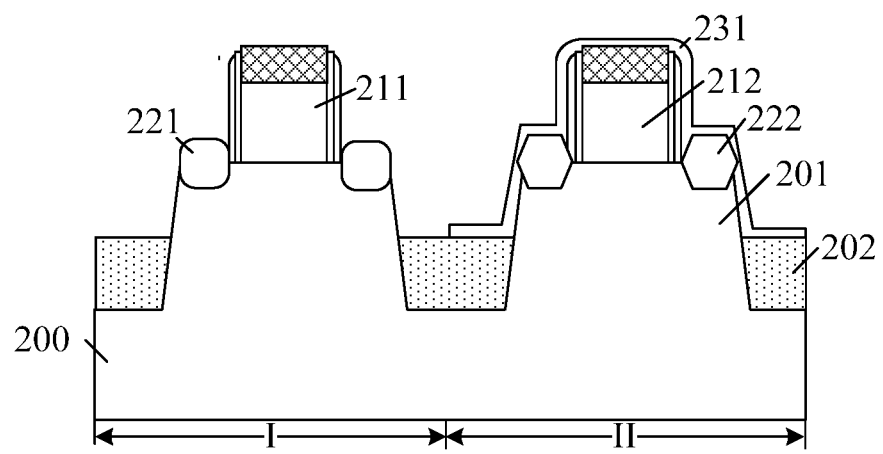

Subsequently a protective layer is formed on the second doped layer. FIGS. 4 and 5 illustrate the process of forming the protective layer in one embodiment.

As shown in FIG. 4, an initial protective layer 230 is formed in the first doped region 221 and the second doped region 222.

The initial protective layer 230 is used to subsequently form a protective layer.

In one embodiment, the initial protective layer 230 covers the first doped region 221, the first gate structure 211, the second doped region 222, and the second gate structure 222.

In one embodiment, the initial protective layer 230 is made of a different material from the second doped region 222 and the first doped region 221. Thus, the loss to the first doped region 221 can be reduced when subsequently removing the initial protective layer 230 in the first doped region 221, and the loss to the second doped region 222 can be reduced when subsequently removing the protective layer in the second doped region 222. For example, in one embodiment, the initial protective layer 230 may be made of one or more of $SiO_2$, $HfO_2$ or $TiO_2$.

In one embodiment, the process of forming the initial protective layer 230 may include a chemical vapor deposition process.

If the thickness of the initial protective layer 230 is too large, the subsequent etching process tends to be difficult; and if the thickness of the initial protective layer 230 is too small, the second doped region 222 is prevented from being protected. For example, the initial protective layer 230 may have a thickness in a range of approximately 10 Å to 100 Å, such as 35 Å.

As shown in FIG. 5, the initial protective layer 230 in the first doped region 221 is removed to form the protective layer 231.

The protective layer 231 is used to protect the second doped region 222 during the subsequent first metallization process, preventing contact between the subsequently formed first metal layer and the second doped region 222 and suppressing reaction between the metal layer and the second doped region 222.

In one embodiment, the protective layer 231 and the initial protective layer 230 are made of the same material. For example, the protective layer 231 may be made of one or more of $SiO_2$, $HfO_2$ or $TiO_2$.

In one embodiment, the thickness of the protective layer 231 is the same as the thickness of the initial protective layer 230. For example, the thickness of the protective layer 231 may be in a range of approximately 10 Å to 100 Å, such as 35 Å.

In one embodiment, the process of removing the initial protective layer 230 in the first doped region 221 includes forming a photoresist on the initial protective layer 230 of the second region II; etching the initial protective layer 230 with the photoresist as a mask so as to remove the initial protective layer 230 in the first region, and forming the protective layer 231.

In one embodiment, the process of etching the initial protective layer 230 may include a dry etching process or a wet etching process.

Returning to FIG. 18, the fabrication method further includes forming a dielectric layer, a first metal gate structure, and a second metal gate structure (S104).

After forming the protective layer 231, a dielectric layer is formed in the first region I and the second region II of the substrate. The dielectric layer in the first region I has a first contact hole, and the first contact hole penetrates through the dielectric layer in the first doped region 221. The dielectric layer in the second region II has a second contact hole, and the second contact hole penetrates through the dielectric layer in the second doped region 222. A first metal gate structure and a second metal gate structure are then formed.

In one embodiment, the dielectric layer may include a lower dielectric layer covering the sidewall of the first metal gate structure and the sidewall of the second metal gate structure and an upper dielectric layer located on the first metal gate structure, the second metal gate structure and the lower dielectric layer. FIGS. 6~13 illustrate the process of forming the dielectric layer, the first metal gate structure, and the second metal gate structure.

Figure 6:
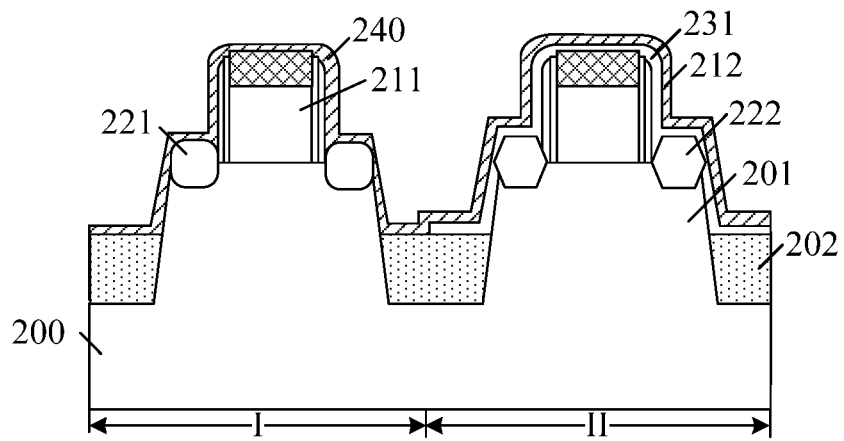

As shown in FIG. 6, a stop layer 240 is formed on the first doped region 221 and the protective layer 231. The stop layer 240 and the protective layer 231 are made of different materials. The stop layer 240 and the first doped region 221 are also made of different materials.

The stop layer 240 is used as an etching stop layer for subsequently etching the initial dielectric layer, such that the process of subsequently etching the initial dielectric layer can be well controlled.

In one embodiment, the stop layer 240 and the protective layer 231 are made of different materials, and therefore the loss of the protective layer is reduced when subsequently removing the stop layer 240 in the second region 222; the stop layer 240 and the first doped region 221 are also made of different materials, and therefore the loss to the first doped region 221 can be reduced when subsequently etching the stop layer 240.

In one embodiment, the stop layer 240 is made of silicon nitride.

If the thickness of the stop layer 240 is too small, it is not advantageous for controlling the subsequent etching process of the initial dielectric layer; if the thickness of the stop layer 240 is too large, the subsequent etching process of the stop layer 240 can easily become more difficult. For example, the thickness of the stop layer 240 may be in a range of approximately 30 to 120 Å.

The initial dielectric layer is subsequently formed on the stop layer 240.

In one embodiment, the initial dielectric layer includes an initial lower dielectric layer and an initial upper dielectric layer. FIGS. 7 to 16 illustrate the process of forming the initial dielectric layer, the first metal gate structure, and the second metal gate structure.

Figure 7:
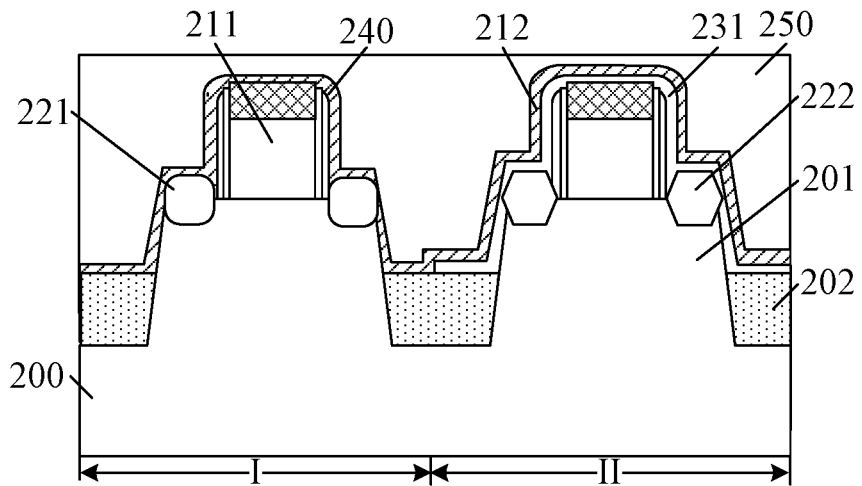

As shown in FIG. 7, an initial lower dielectric layer 250 is formed, covering the top surfaces and the sidewalls of the first gate structure 211 and the second gate structure 212. The initial lower dielectric layer 250 and the stop layer 231 are made of different materials.

The initial lower dielectric layer 250 is used to subsequently form the lower dielectric layer.

The initial lower layer dielectric layer 250 and the stop layer 231 are made of different materials, which is advantageous for controlling the etching process when subsequently etching the dielectric layer.

In one embodiment, the initial lower dielectric layer 250 may be made of silicon oxide.

In one embodiment, the process of forming the lower dielectric layer 250 includes a chemical vapor deposition process.

Figure 8:
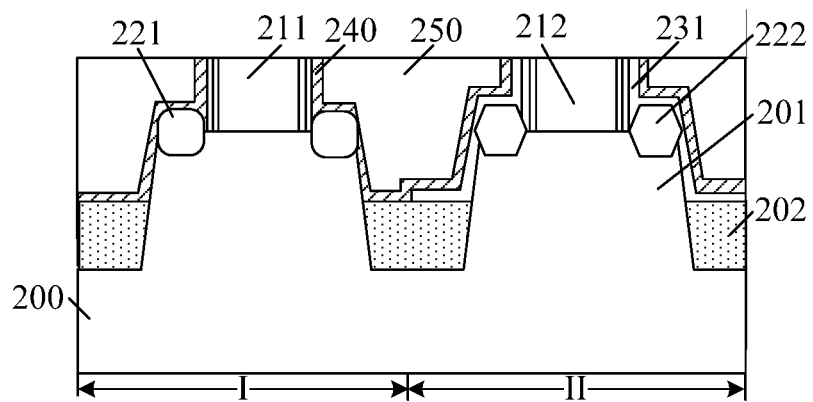

As shown in FIG. 8, the initial lower dielectric layer 250 is planarized to expose the first gate structure 211 and the second gate structure 212.

In one embodiment, the planarization process includes a chemical mechanical polishing process.

In one embodiment, the fabrication method further includes removing the first mask layer and the second mask layer after the planarization process.

Figure 9:
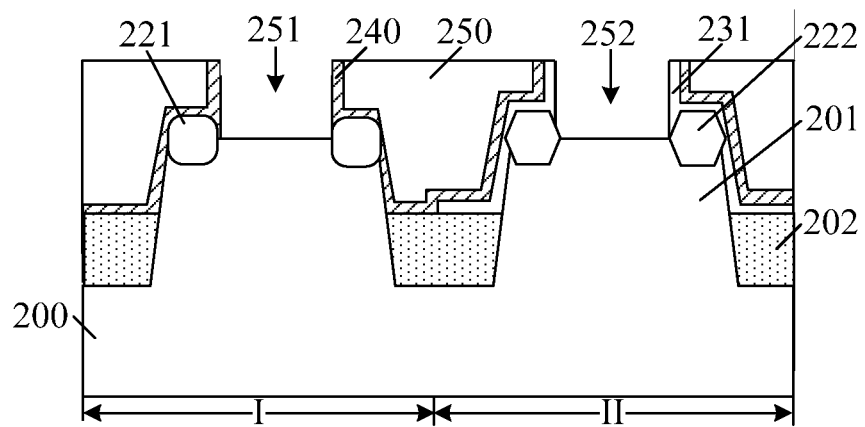

As shown in FIG. 9, the first gate structure 211 is removed (as shown in FIG. 8), forming a first opening 251 on the lower dielectric layer 250 in the first region I, and the second gate structure 212 is removed to form a second opening 252 on the initial lower dielectric layer 250 in the second region II.

The first opening 251 is used to subsequently accommodate a first metal gate structure, and the second opening 252 is used to subsequently accommodate a second metal gate structure.

In one embodiment, the process of removing the first gate structure 211 and the second gate structure 212 includes a dry etching process or a wet etching process.

Figure 10:
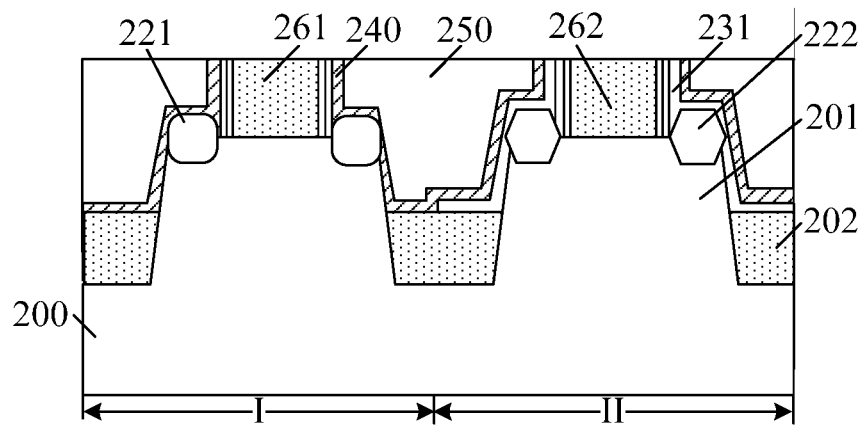

As shown in FIG. 10, a first metal gate structure 261 is formed in the first opening 251 (as shown in FIG. 9), and a second metal gate structure 262 is formed in the second opening 252 (as shown in FIG. 9).

In one embodiment, the first metal gate structure 261 includes a first metal gate dielectric layer located at the bottom surface of the first opening 251 and a first metal gate electrode located at the first metal gate dielectric layer.

In one embodiment, the second metal gate structure 262 includes a second metal gate dielectric layer at the bottom surface of the second opening 252 and a second metal gate electrode located on the second metal gate dielectric layer.

In one embodiment, the first metal gate dielectric layer and the second metal gate dielectric layer may be made of a high-K dielectric material, such as $HfO_2$, $La_2O_3$, HfSiON, $HfAlO_2$, $ZrO_2$, $Al_2O_3$ or $HfSiO_4$.

In one embodiment, the process of forming the first metal gate dielectric layer and the second metal gate dielectric layer includes a chemical vapor deposition process.

In one embodiment, the first metal gate electrode and the second metal gate electrode may be made of one or more of Al, Cu, Ag, Au, Ni, Ti, W, WN and WSi.

In one embodiment, the process of forming the first metal gate electrode and the second metal gate electrode includes a chemical vapor deposition process.

Figure 11:
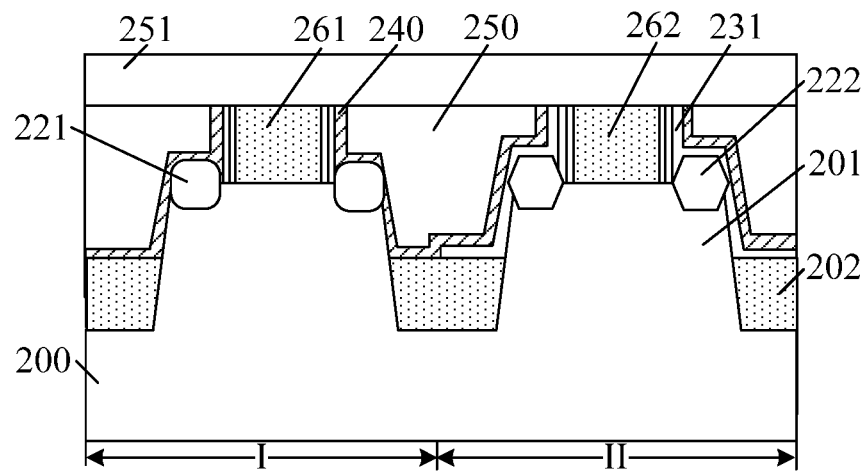

As shown in FIG. 11, an initial upper dielectric layer 251 is formed on the initial lower dielectric layer 250, the first metal gate structure 261, and the second metal gate structure 262.

The initial upper dielectric layer 251 is used to subsequently form an upper dielectric layer. The initial dielectric layer is composed of the initial upper dielectric layer 251 and the initial lower dielectric layer.

In one embodiment, the initial upper dielectric layer 251 is made of silicon oxide.

In one embodiment, the process of forming the initial upper dielectric layer 251 includes a chemical vapor deposition process. In other embodiments, the process of forming the initial upper dielectric layer may also include a physical vapor deposition process or an atomic layer deposition process.

Figure 12:
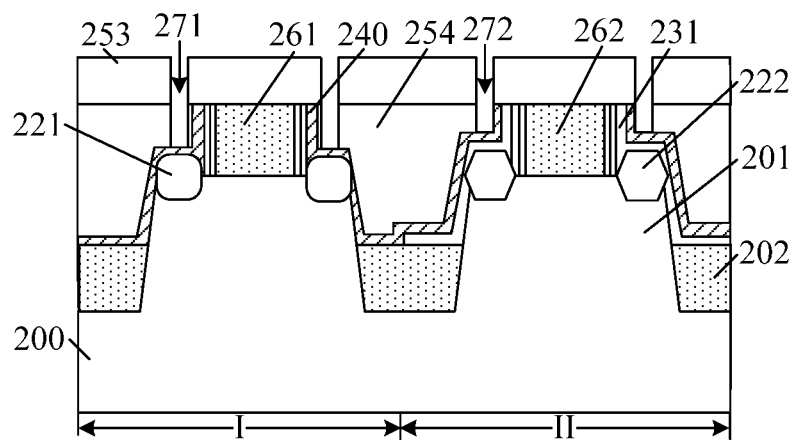

As shown in FIG. 12, the initial dielectric layer is etched to form a dielectric layer, with a first contact hole 271 and a second contact hole 272 in the dielectric layer. The first contact hole 271 penetrates through the dielectric layer in the first doped region 221, and the second contact hole 271 penetrates through the dielectric layer in the second doped region 222.

In one embodiment, the first contact hole 271 exposes the stop layer 240 in the first doped region 221, and the second contact hole 272 exposes the stop layer 240 in the second doped region 222.

The dielectric layer is used to achieve electrical insulation between the NMOS transistor and the PMOS transistor, and electrical insulation between the semiconductor structure and the external circuit.

In one embodiment, the process of etching the initial dielectric layer includes etching the initial upper dielectric layer 251 (as shown in FIG. 11) to form an upper dielectric layer 253, and etching the initial lower dielectric layer 251 (as shown in FIG. 11) to form the lower dielectric layer 254.

The lower dielectric layer 254 and the stop layer 240 are made of different materials. The etching rate for the initial lower dielectric layer 250 is much greater than the etch rate for the stop layer 240 when etching the initial dielectric layer, and therefore the stop layer 240 is capable of controlling the etching process of the initial dielectric layer and the loss to the first doped region 221 can be reduced.

In one embodiment, the process of etching the initial dielectric layer includes a dry etching process or a wet etching process.

Figure 13:
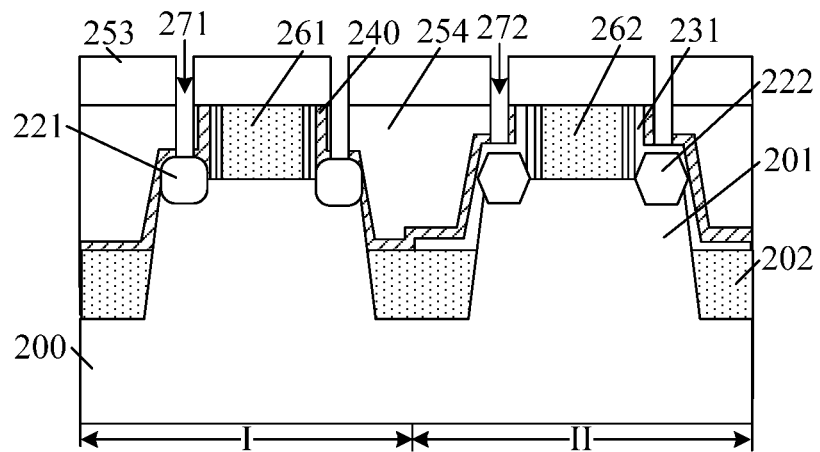

As shown in FIG. 13, the stop layer 240 is etched with the dielectric layer as a mask to remove the stop layer 240 at the bottom of the first contact hole 271 and at the bottom of the second contact hole 272, such that the bottom of the first contact hole 271 can expose the first doping region 221.

The stop layer 240 and the first doped region 221 are made of different materials. The etching rate for the first doped region 221 is much smaller than the etching rate for the stop layer 240 when removing the stop layer 240 in the first doped region 221, and therefore the loss to the first doped region is reduced. By using different materials for the stop layer 240 and the protective layer 231, the loss to the protective layer 231 can be reduced during the etching process of the stop layer 240.

The protective layer 231 may be used to control the etching process during the etching process of the stop layer 240.

In one embodiment, the process of removing the stop layer 240 at the bottom of the first contact hole 271 and the bottom of the second contact hole 272 may include a dry etching process or a wet etching process.

Returning to FIG. 18, the fabrication method further includes forming a first metallide and a second metallide (S105).

Figure 14:
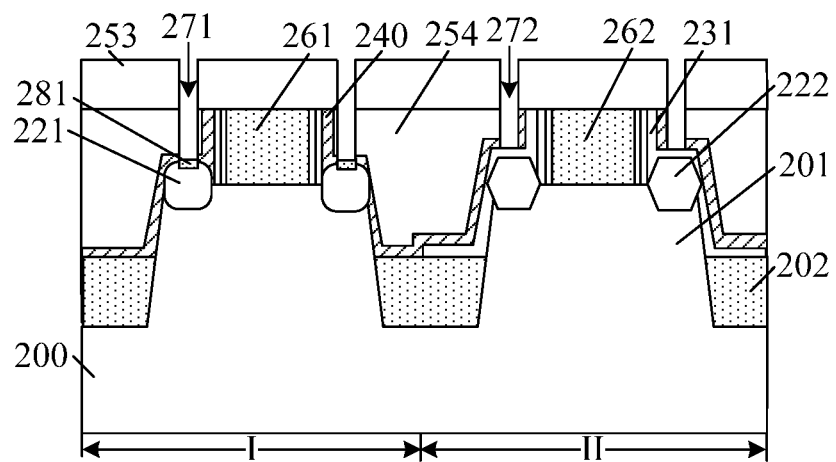

As shown in FIG. 14, the first doped region 221 is subjected to a first metallization process, and a first metallide 281 is formed on the surface of the first doped region 221.

The first metallide 281 is used to reduce the contact resistance between the subsequently formed first plug and the first doped region 221.

The first metallization process includes forming a first metal layer on the protective layer 231 and on the surface of the first doped region 221; forming the first metallide 281 through reaction between the first metal layer and the first doped region 221; and removing the first metal layer 281 on the protective layer 231.

Since the second doped region 222 has a protective layer 231, after forming the first metal layer, the first metal layer does not contact with the second doped region 222. Therefore, the first metal layer does not react with the second doped region 222, and the first metal layer does not react with the protective layer 231, such that the first metal layer on the protective layer 231 can be removed by a subsequent pickling process.

In one embodiment, the first metal layer is also located on the dielectric layer. The first metallization process further includes removing the first metal layer on the dielectric layer.

In one embodiment, the process of removing the protective layer 231 and the first metal layer on the dielectric layer includes a pickling process.

In one embodiment, the first metal layer is made of Ni or NiPt. The first metallide may be made of NiSi or NiPtSi. NiSi and NiPtSi can effectively reduce the height of the barrier between the first doped region 221 of the PMOS transistor and the subsequently formed first plug, thereby reducing the contact resistance between the first doped region 221 and the first metallide and further improving the performance of the formed semiconductor structure.

Figure 15:
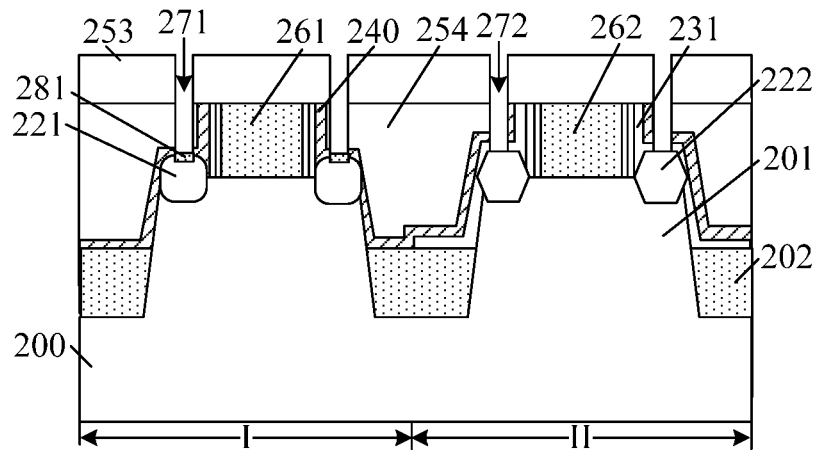
Figure 16:
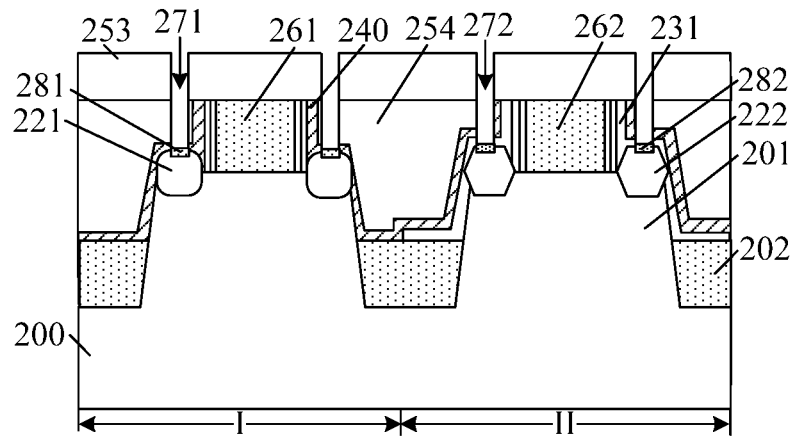

A second metallide is formed on the surface of the second doped region 222. FIGS. 15 and 16 illustrate the process of forming the second metallide in one embodiment.

As shown in FIG. 15, the protective layer 231 in the second doped region 222 is removed to expose the second doped region 222.

The process of removing the protective layer 231 in the second doped region 222 may include a dry etching process or a wet etching process.

The protective layer 231 and the second doped region 222 are made of different materials. The removal rate for the protective layer 231 is much larger than the removal rate for the second doped region 222 when removing the protective layer 231 in the second doped region 222. Therefore, the removing process of the protective layer 231 in the second doped region 222 can be controlled, thereby reducing the loss to the second doped region 222.

As shown in FIG. 16, the second doped region 222 is subjected to a second metallization process, and a second metallide 282 is formed on the surface of the second doped region 222.

The second metallide 282 is used to reduce the contact resistance between the subsequently formed second plug and the second doped region 222.

The second metallide 282 and the first metallide 281 are made of different materials. Since the doping ions in the second doped region 222 and the doping ions in the first doped region 221 have opposite conductivity types and the second metallide 282 is made of a different material from the first metallide 281, the materials of the first metallide 281 and the second metallide 282 can be selected based on the nature of the doping ions in the first doped region 221 and the second doped region 222. As such, the barrier height on the contact surface between the first metallide and the first doped layer and the barrier height on the contact surface between the second metallide and the second doped layer can be reduced separately, such that the contact resistance between the first metallide and the first doped layer and the contact resistance between the second metallide and the second doped layer can be effectively reduced and the performance of the formed semiconductor structure can be improved.

The disclosed fabrication method can reduce the contact resistance between the first doped region 221 and the subsequently formed first plug and reduce the contact resistance between the second doped region 222 and the subsequently formed second plug, thereby improving the performance of the formed semiconductor structure.

The second metallization process includes forming a second metal layer on the first metallide 281 and on the surface the second doped region 222; forming the second metallide 282 through reaction between the second metal layer and the second doped region 222; and removing the second metal layer on the first metal silicide 281.

In one embodiment, the second metal layer is also located on the dielectric layer. The second metallization process further includes removing the second metal layer on the dielectric layer.

In one embodiment, the process of removing the first metallide 281 and the second metal layer on the dielectric layer includes a pickling process.

In one embodiment, the second metal layer is made of Ti, and the second metallide is made of TiSi. TiSi can effectively reduce the height of the barrier between the second doped region 222 of the NMOS transistor and the second metallide 282 and reduce the contact resistance between the second doped region 222 and the second metallide 282, thereby reducing the resistance between the second plug and the second doped region and improving the performance of the formed semiconductor structure.

Because the Si atoms in NiSi and NiPtSi are prevented from diffusing into the metal Ti due to the blocking of the Ni atoms, the first metallide 281 cannot easily react with the second metal layer. Thus, the second metal layer on the first metallide 281 can be removed by a pickling process.

As shown in FIG. 17, a first plug 291 connecting to the first metallide 281 is formed, and a second plug 292 connecting to the second metallide 282 is formed.

The first plug 291 is used to electrically connect the first doped region 221 with the external circuitry, and the second plug 292 is used to electrically connect the second doped region 222 with the external circuitry.

In one embodiment, the first plug 291 and the second plug 292 may be made of W. In other embodiments, the first plug and the second plug may also be made of Cu.

In one embodiment, the process of forming the first plug 291 and the second plug 292 may include a chemical vapor deposition process or a physical vapor deposition process.

In the disclosed method of forming a semiconductor structure, the doping ions in the second doped region and the doping ions in the first doped region have opposite conductivity types, and the second metallide and the first metallide are made of different materials. The materials of the first metallide and the second metallide can be selected according to the properties of the doping ions in the first doped layer and the second doped layer, such that the barrier height on the contact surface between the first metallide and the first doped layer and the barrier height on the contact surface between the second metallide and the second doped layer can be effectively reduced. As a result, the contact resistance between the metallide and the first doped layer and the contact resistance between the second metallide and the second doped layer can be effectively reduced, thereby improving the performance of the formed semiconductor structure.

Further, the protective layer is formed before performing the first metallization process. The protective layer can isolate the first metal layer and the second doped layer during the first metallization process to prevent the first metal layer from reacting with the second doped layer, thereby reducing the effect of the first metal layer on the contact resistance between the second plug and the second doped layer. In the meantime, the contact resistance between the second plug and the second doped layer can be reduced by a second metallization process. In addition, the protective layer is formed before the first metallization process, and the first contact hole and the second contact hole can be formed by a one-time etching process, thereby simplifying the process flow.

Accordingly, the present disclosure also provides a semiconductor structure.

As shown in FIG. 17, the semiconductor structure includes: a substrate, including a first region I and a second region II; a first doped region 221 located in the first region I of the substrate, with first doping ions in the first doped region 221; a second doped region 222 in the second region II of the substrate, with second doping ions in the second doped region 222. The second doping ions and the first doping ions have opposite conductivity types. The semiconductor structure further includes a first metallide 281 located on the surface of the first doped region 221 and a second metallide 282 located on the surface of the second doped region 222. The second metallide 282 and the first metallide 281 are made of different materials.

In one embodiment, the semiconductor structure may further include a first plug 291 connecting to the first metallide 281 and a second plug 292 connecting to the second metallide 282.

The doping ions in the second doped region and the doping ions in the first doped region have opposite conductivity types, and the second metallide and the first metallide are made of different materials. The materials of the first metallide and the second metallide can be selected according to the properties of the doping ions in the first doped layer and the second doped layer, such that the height of the barrier on the contact surface between the first metallide and the first doped layer and the height of the barrier on the contact surface between the second metallide and the second doped layer can be effectively reduced. As a result, the contact resistance between the metallide and the first doped layer and the contact resistance between the second metallide and the second doped layer can be effectively reduced, thereby improving the performance of the formed semiconductor structure. The fabrication method can also reduce the contact resistance between the first doped region 221 and the first plug 291 and reduce the contact resistance between the second doped region 222 and the second plug 292, improving the performance of the formed semiconductor structure.

In one embodiment, the first region I is used to form a PMOS transistor, and the second region II is used to form an NMOS transistor. In other embodiments, the first region and the second region may also be used to form a triode or a diode.

In one embodiment, the substrate includes a base substrate 200 and a plurality of fins 201 on the base substrate 200.

In one embodiment, the semiconductor structure further includes an isolation structure 202 on the base substrate 200. The isolation structure 202 covers a portion of the sidewall of the fins 201, and the surface of the isolation structure 202 is lower than the top surface of the fins 201.

In one embodiment, the first metallide may be made of NiSi or NiPtSi. NiSi and NiPtSi can effectively reduce the height of the barrier between the first doped region 221 of the PMOS transistor and the subsequently formed first plug, thereby reducing the contact resistance between the first doped region 221 and the first plug and further improving the performance of the formed semiconductor structure.

In one embodiment, the second metallide may be made of TiSi. TiSi can effectively reduce the height of the barrier between the second doped region 222 of the NMOS transistor and the second metallide 282 and reduce the contact resistance between the second doped region 222 and the second metallide 282, thereby reducing the contact resistance between the second doped region 222 and the second plug and improving the performance of the formed semiconductor structure.

In one embodiment, the first doped region 221 is used as a source/drain doped region of the PMOS transistor to be formed. In other embodiments, the first region is used to form a diode, with the first doped region forming the anode of the diode.

In one embodiment, the first region I is used to form a PMOS transistor, and the first doping ions are P-type ions, for example, boron ion or $BF^{2-}$ ion.

In one embodiment, the second doped region 222 is used as the source/drain doped region of the NMOS transistor to be formed. In other embodiments, the first doped region is used to form the anode of a diode, and the second doped region is used to form the cathode of a diode.

In one embodiment, the second region II is used to form an NMOS transistor, and the second doping ions are N-type ions, such as phosphorous or arsenic ions.

In one embodiment, the semiconductor structure further includes a first metal gate structure 261 on the first region I of the substrate and a second metal gate structure 262 on the second region II of the substrate. In other embodiments, the first metal gate structure and the second metal gate structure may not be included.

In other embodiments, the first region is used to form a diode or a triode, and the semiconductor structure does not include forming the first metal gate structure and the second metal gate structure.

In one embodiment, the semiconductor structure further includes a dielectric layer covering the first doped region 221 and the second doped region 222.

In one embodiment, the dielectric layer includes a lower dielectric layer 254 on the first doped region 221 and the second doped region 222, and the lower dielectric layer 254 covers the sidewalls of the first metal gate structure 261 and the second metal gate structure 262. The dielectric layer further includes an upper dielectric layer 253 on the first metal gate structure 261, the second metal gate structure 262, and the lower dielectric layer 254.

In one embodiment, the lower dielectric layer 254 and the upper dielectric layer 253 are made of silicon oxide. In other embodiments, the lower dielectric layer and the upper dielectric layer may also be made of silicon oxynitride.

In one embodiment, the semiconductor structure further includes a protective layer 231 located on the isolation structure 202 in the second region II and on the sidewall of the fins 201, and a stop layer 240 between the protective layer and the dielectric layer, between the fin in the first region I and the dielectric layer, and between the isolation structure 202 in the first region I and the dielectric layer.

In one embodiment, the first plug 291 and the second plug 292 are made of tungsten. In other embodiments, the first plug and the second plug may also be made of copper.

In one embodiment, the substrate, the protective layer 231, the stop layer 240, the dielectric layer, the first metal gate structure 261, the second metal gate structure 262, the first metallide 281, the second metallide 282, the first plug 281, and the second plug 282 are made of the same material with those in the previous embodiment and will not be described here.

As such, in the semiconductor structure of the disclosed embodiment, the doping ions in the second doped region and the doping ions in the first doped region have opposite conductivity types, and the second metallide and the first metallide are made of different materials. The materials of the first metallide and the second metallide can be selected according to the properties of the doping ions in the first doped layer and the second doped layer, such that the height of the barrier on the contact surface between the first metallide and the first doped layer and the height of the barrier on the contact surface between the second metallide and the second doped layer can be effectively reduced. As a result, the contact resistance between the metallide and the first doped layer and the contact resistance between the second metallide and the second doped layer can be effectively reduced, thereby improving the performance of the formed semiconductor structure.

In one embodiment, the disclosed fabrication process may include a dual silicide process for forming FinFETs in a 10 nm or lower level. The materials for the first silicide process (e.g., NiSi) and the second silicide process (e.g., TiSi) can be different and can be selected according to the conductivity types of the doping ions in the semiconductor structure. Therefore, the contact resistance of the semiconductor structure can be reduced and the performance of the semiconductor structure is improved.

Compared with the conventional fabrication method, the method in the disclosure is advantageous.

In the formation method of a semiconductor structure provided by the present disclosure, the doping ions in the second doped region and the doping ions in the first doped region have opposite conductivity types, and the second metallide and the first metallide are made of different materials. The materials of the first metallide and the second metallide can be selected according to the properties of the doping ions in the first doped layer and the second doped layer, such that the height of the barrier on the contact surface between the first metallide and the first doped layer and the height of the barrier on the contact surface between the second metallide and the second doped layer can be effectively reduced. As a result, the contact resistance between the metallide and the first doped layer and the contact resistance between the second metallide and the second doped layer can be effectively reduced, thereby improving the performance of the formed semiconductor structure.

Further, the protective layer is formed before the first metallization process. The protective layer can isolate the first metal layer and the second doped layer during the first metallization process to prevent the first metal layer from reacting with the second doped layer, thereby reducing the effect of the first metal layer on the contact resistance between the second metallide and the second doped layer. In the meantime, the contact resistance between the second metallide and the second doped layer can be reduced by the second metallization process. In addition, the protective layer is formed before the first metallization process, and the first contact hole and the second contact hole can be formed by the a one-time etching process, thereby simplifying the process flow.

In the semiconductor structure provided by the disclosed embodiment, the doping ions in the second doped region and the doping ions in the first doped region have opposite conductivity types, and the second metallide and the first metallide are made of different materials. The materials of the first metallide and the second metallide can be selected according to the properties of the doping ions in the first doped layer and the second doped layer, such that the height of the barrier on the contact surface between the first metallide and the first doped layer and the height of the barrier on the contact surface between the second metallide and the second doped layer can be effectively reduced. As a result, the contact resistance between the metallide and the first doped layer and the contact resistance between the second metallide and the second doped layer can be effectively reduced, thereby improving the performance of the formed semiconductor structure.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
    providing a substrate, including a first region and a second region;
    forming a first doped region in the first region of the substrate, the first doped region having first doping ions;
    forming a second doped region in the second region of the substrate, the second doped region having second dopant ions with a conductivity type opposite to the first doping ions;
    forming a protective layer on the second doped region and simultaneously exposing the first doped region;
    forming a first metal layer on the protective layer and on the surface of the first doped region;
    forming a first metallide on a surface of the first doped region having the first doping ions by a first metallization process, such that the first metal layer reacts with the first doped region to form the first metallide;
    removing the first metal layer on the protective layer and the protective layer to expose a surface of the second doped region;
    forming a second metal layer on the surface of the second doped region; and
    forming a second metallide on the surface of the second doped region having the second doping ions by a second metallization process, such that the second metal layer reacts with the second doped region to form the second metallide, the second metallide and the first metallide being made of different materials.

2. The method according to claim 1, wherein:
    the first doping ions are P-type ions and the second doping ions are N-type ions; and
    the first metallide is made of one or more of PtSi, NiPtSi and NiSi and the second metallide is made of TiSi.

3. The method according to claim 1, wherein:
    the protective layer has a material different from the second doped region, after forming the protective layer, performing a first metallization process to metallize the first doped region to form the first metallide on the surface of the first doped region; and
    forming the second metallide includes removing the protective layer on the second doped region to expose the second doping region after the first metallization process; and after removing the protective layer in the second doped region, performing a second metallization process to metallize the second doped region to form the second metallide on the surface of the second doped region.

4. The method according to claim 3, wherein:
    forming the protective layer includes forming an initial protective layer on the first doped region and the second doped region and removing the initial protective layer on the first doped region to form a protective layer.

5. The method according to claim 4, wherein:
    removing the initial protective layer on the first doped region includes a dry etching process or a wet etching process.

6. The method according to claim 3, wherein:
    the first doping ions are P-type ions, and the second doping ions are N-type ions; and
    the first metal layer is made of one or more of Pt, NiPt and Ni, and the second metal layer is made of Ti.

7. The method according to claim 3, after forming the protective layer and before performing the first metallization process, further comprising:
    forming a dielectric layer on the first region and the second region of the substrate, the dielectric layer having a first contact hole there-through in the first doped region and having a second contact hole there-through in the second doped region.

8. The method according to claim 7, wherein forming the dielectric layer comprises:
    forming a stop layer on the first doped region and the protective layer, the stop layer and the dielectric layer being made of different materials;
    forming an initial dielectric layer on the stop layer;
    etching the initial dielectric layer to form a dielectric layer having the first contact hole and the second contact hole;
    etching the stop layer using the dielectric layer as a mask to remove the stop layer at the bottom of the first contact hole and the second contact hole, such that the first contact hole exposes the first doped region and the second contact hole exposes the second doped region.

9. The method according to claim 8, wherein:
    etching the initial dielectric layer includes a dry etching process or a wet etching process.

10. The method according to claim 7, before forming the first doped region, further comprising:
    forming a first gate structure in the first region of the substrate, and the first doped layer being located on both sides of the first gate structure, respectively; and
    before forming the second doped region, further comprising:
    forming a second gate structure in the second region of the substrate, and the second doped layer being located on both sides of the second gate structure.

11. The method according to claim 10, further comprising:
    forming a first metal gate structure and a second metal gate structure,
    wherein: the dielectric layer includes an upper dielectric layer and a lower dielectric layer, and forming the dielectric layer, the first metal gate structure, and the second metal gate structure includes:
        forming the lower dielectric layer on the substrate after forming the protective layer, with the lower dielectric layer covering the first doped region, the second doped region, a sidewall of the first gate structure, and a sidewall of the second gate structure, exposing a top surface of the first gate structure and a surface of the second gate structure;
        removing the first gate structure to form a first opening and removing the second gate structure to form a second opening;

forming a first metal gate structure in the first opening;
forming a second metal gate structure in the second opening; and
forming the upper dielectric layer on the lower dielectric layer, the first metal gate structure, and the second metal gate structure.

12. The method according to claim 3, wherein:
the protective layer is made of one or more of $SiO_2$, $HfO_2$ and $TiO_2$.

13. The method according to claim 8, wherein:
the dielectric layer is made of silicon oxide; and
the stop layer is made of silicon nitride.

14. The method according to claim 3, wherein:
forming the protective layer includes a chemical vapor deposition process or a physical vapor deposition process; and
removing the protective layer on the second doped region includes a dry etching process or a wet etching process.

15. The method according to claim 3, wherein:
a thickness of the protective layer is in a range of approximately 10 angstroms to 100 angstroms.

16. The method according to claim 1, further comprising:
forming a first plug connecting to the first metallide; and
forming a second plug connecting to the second metallide.

* * * * *